(12) United States Patent
Gulaka et al.

(10) Patent No.: US 9,964,614 B2
(45) Date of Patent: May 8, 2018

(54) MAGNETIC RESONANCE IMAGING APPARATUS AND METHOD OF OPERATING THE SAME

(71) Applicant: SAMSUNG ELECTRONICS CO., LTD., Suwon-si (KR)

(72) Inventors: Praveen Gulaka, Suwon-si (KR); Sang-cheon Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 721 days.

(21) Appl. No.: 14/539,587

(22) Filed: Nov. 12, 2014

(65) Prior Publication Data
US 2015/0168522 A1 Jun. 18, 2015

(30) Foreign Application Priority Data
Dec. 18, 2013 (KR) .................... 10-2013-0158679

(51) Int. Cl.
*G01R 33/48* (2006.01)
*G01R 33/561* (2006.01)
*G01R 35/00* (2006.01)
*G01R 33/56* (2006.01)

(52) U.S. Cl.
CPC ....... *G01R 33/4818* (2013.01); *G01R 33/561* (2013.01); *G01R 33/5608* (2013.01); *G01R 35/005* (2013.01)

(58) Field of Classification Search
CPC .................. G01R 33/4818; G01R 33/561
See application file for complete search history.

(56) References Cited

U.S. PATENT DOCUMENTS

| | | | |
|---|---|---|---|
| 5,377,680 | A | 1/1995 | Bernstein et al. |
| 5,435,303 | A | 7/1995 | Bernstein et al. |
| 5,713,358 | A | 2/1998 | Mistretta et al. |
| 9,213,075 | B2 | 12/2015 | Miyazaki et al. |
| 2004/0155652 | A1 | 8/2004 | Sodickson |
| 2006/0214660 | A1 | 9/2006 | Lustig et al. |

(Continued)

FOREIGN PATENT DOCUMENTS

| | | |
|---|---|---|
| EP | 2 503 349 A1 | 9/2012 |
| JP | 2013-240571 A | 12/2013 |

(Continued)

OTHER PUBLICATIONS

Communication dated Feb. 17, 215 issued by the Int. Searching Authority in counterpart Int. Application No. PCT/KR2014/010610 (PCT/ISA/210 & 237).

(Continued)

*Primary Examiner* — Gregory H Curran
(74) *Attorney, Agent, or Firm* — Sughrue Mion, PLLC

(57) ABSTRACT

An MRI apparatus includes a data processor for obtaining first k space data including a first unacquired line by undersampling an MR signal based on a first value of an MR parameter, and for obtaining second k space data including a second unacquired line by undersampling an MR signal based on a second value of the MR parameter; and an image processor for interpolating a portion of first unacquired line data in the first k space data based on the second k space data, and a portion of second unacquired line data in the second k space data based on the first k space data.

30 Claims, 12 Drawing Sheets

(56) References Cited

U.S. PATENT DOCUMENTS

| | | | |
|---|---|---|---|
| 2008/0068014 A1 | 3/2008 | Dannels | |
| 2008/0107319 A1 | 5/2008 | Chang et al. | |
| 2008/0278160 A1 | 11/2008 | Griswold et al. | |
| 2009/0224759 A1 | 9/2009 | Kholmovski et al. | |
| 2011/0241670 A1 | 10/2011 | Lai et al. | |
| 2012/0092009 A1 | 4/2012 | Zhang et al. | |
| 2013/0278256 A1 | 10/2013 | Ahmad et al. | |
| 2013/0285662 A1* | 10/2013 | Takeshima | G01R 33/543 324/318 |
| 2013/0335080 A1 | 12/2013 | Jo et al. | |

FOREIGN PATENT DOCUMENTS

| | | |
|---|---|---|
| KR | 10-1301490 B1 | 8/2013 |
| WO | 00/72036 A1 | 11/2000 |

OTHER PUBLICATIONS

Mariya Doneva et al.; "Compressed Sensing Reconstruction for Magnetic Resonance Parameter Mapping"; Magnetic Resonance in Medicine; vol. 64; 2010; pp. 1114-1120; DOI: 10.1002/mrm.22483.

Alexey Samsonov; "A Novel Reconstruction Approach Using Model Consistency Condition for Accelerated Quantitative MRI (MOCCA)"; Proc. Intl. Soc. Mag. Reson. Med.; vol. 20; 2012; p. 358.

Communication issued by the European Patent Office dated Nov. 16, 2017 in counterpart European Patent Application No. 14870948.8.

N.J. Shah et al., "Multi-Channel Line-Sharing for Rapid T1 Mapping: Application to TAPIR", Proceedings of the International Society for Magnetic Resonance in Medicine, 16th Annual Meeting and Exhibition (May 3-9, 2008), Apr. 19, 2008, p. 1431, vol. 16, XP040604638, Toronto, Canada.

Feng Huang et al., "k-t GRAPPA: A k-space Implementation for Dynamic MRI with High Reduction Factor", Magnetic Resonance in Medicine, Sep. 28, 2005, pp. 1172-1184, vol. 54, No. 5, XP055163493, DOI: 10.1002/mrm.20641.

Mark Doyle et al., "Block Regional Interpolation Scheme for k-Space (BRISK): A Rapid Cardiac Imaging Technique", Magnetic Resonance in Medicine, John Wiley & Sons, Inc, US, Jan. 1, 1995, pp. 163-170, vol. 33, XP002035245.

Alexei A. Samsonov et al., "POCSENSE: POCS-Based Reconstruction for Sensitivity Encoded Magnetic Resonance Imaging", Magnetic Resonance in Medicine, Nov. 23, 2004, pp. 1397-1406, vol. 52, No. 6, XP055007233, DOI: 10.1002/mrm.20285.

Haifeng Wang et al., "Improving GRAPPA Using Cross-Sampled Autocalibration Data", Magnetic Resonance in Medicine, Aug. 23, 2011, pp. 1042-1053, vol. 67, No. 4, XP055023973, DOI: 10.1002/mrm.23083.

Communication dated Feb. 13, 2018, issued by the Korean Intellectual Property Office in counterpart Korean Patent Application No. 10-2013-00158679.

* cited by examiner

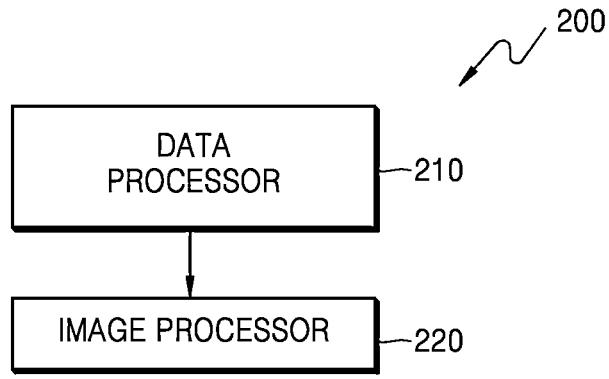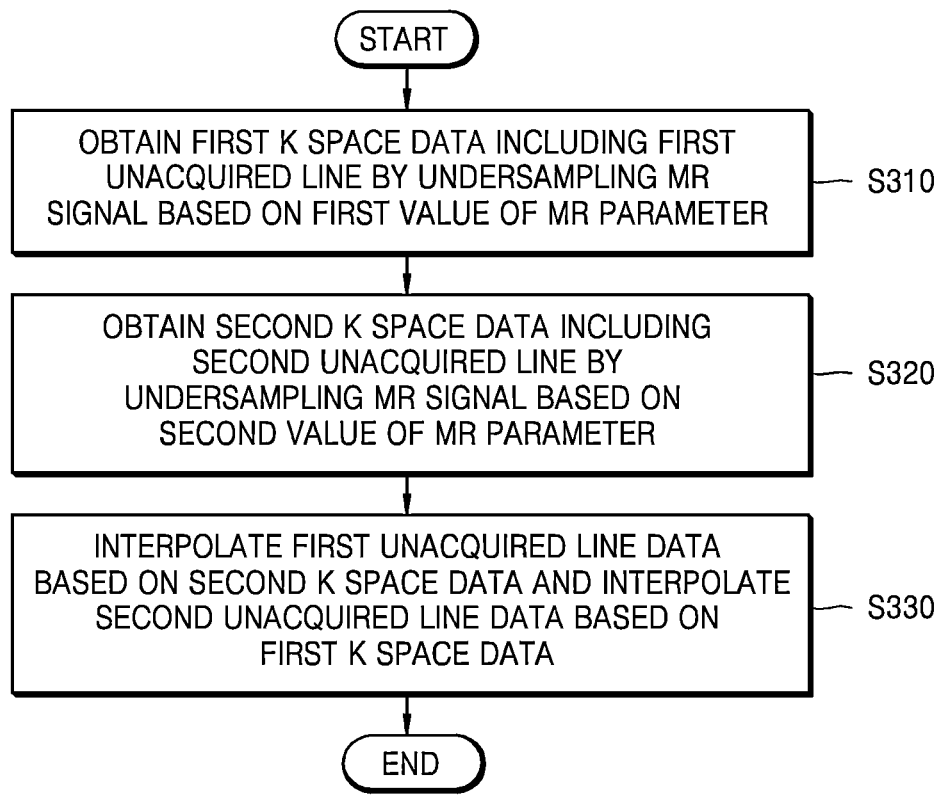

MAGNETIC RESONANCE IMAGING APPARATUS AND METHOD OF OPERATING THE SAME

CROSS-REFERENCE TO RELATED APPLICATION

This application claims priority from Korean Patent Application No. 10-2013-0158679, filed on Dec. 18, 2013, in the Korean Intellectual Property Office, the disclosure of which is incorporated herein in its entirety by reference.

BACKGROUND

1. Field

One or more exemplary embodiments relate to a magnetic resonance imaging (MRI) apparatus and a method of operating the same, and more particularly, to an MRI apparatus and a method of operating the same, wherein data of a partial region is shared to interpolate data between undersampled k spaces.

2. Description of the Related Art

In MRI, an image is generated by using information obtained by exposing an atomic nucleus to a magnetic field and resonating the atomic nucleus. Resonance of an atomic nucleus is a phenomenon wherein, when a certain high frequency signal is incident on an atomic nucleus in a magnetic state caused by an external magnetic field, an atomic nucleus in a low energy state absorbs energy of the certain high frequency signal, thereby being excited to a high energy state. Atomic nuclei have different resonance frequencies according to their types, and resonance is affected by the strength of an external magnetic field. The human body has multitudinous atomic nuclei, and hydrogen atomic nuclei are used during MRI.

MRI systems may acquire two-dimensional (2D) images or three-dimensional (3D) volume images while not using X-ray radiation, as compared to computed tomography (CT), X-ray, positron emission tomography (PET), and single photon emission CT (SPECT), and may acquire images having high soft tissue contrast, neurological images, intravascular images, musculoskeletal images, and oncologic images that are important in detecting abnormal tissues.

Recently, technologies for quickly performing MRI have been studied.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

One or more exemplary embodiments include an MRI apparatus and a method of operating the same, wherein the quality of an MR image may be maintained or improved while reducing a time taken for obtaining k space data.

According to one or more exemplary embodiments, an MRI apparatus includes: a data processor for obtaining first k space data including a first unacquired line by undersampling an MR signal based on a first value of an MR parameter, and for obtaining second k space data including a second unacquired line by undersampling an MR signal based on a second value of the MR parameter; and an image processor for interpolating at least a part of first unacquired line data in the first k space data based on the second k space data, and for interpolating at least a part of second unacquired line data in the second k space data based on the first k space data.

The data processor may obtain the first k space data including the first unacquired line in a second region by sampling an MR signal corresponding to a first region of a k space and an MR signal corresponding to a part of the second region of the k space, and obtain the second k space data including the second unacquired line in the second region by sampling the MR signal corresponding to the first region and the MR signal corresponding to the part of the second region, and the image processor may interpolate the first unacquired line data based on acquired line data of a second k space corresponding to the first unacquired line, and interpolate the second unacquired line data based on acquired line data of a first k space corresponding to the second unacquired line.

The first region may be a central region of the k space and the second region may be a peripheral region of the k space.

The first region may be an auto-calibration signal (ACS) region.

K space data corresponding to the first region may be low frequency data, and k space data corresponding to the second region may be high frequency data.

The image processor may interpolate the first unacquired line data and the second unacquired line data based on a weight of the first k space and a weight of the second k space.

The image processor may calculate the weight of the first k space based on data of the first region of the first k space, and calculate the weight of the second k space based on data of the first region of the second k space.

The image processor may calculate a Euclidean norm value of the first region of the first k space as the weight of the first k space, and calculate a Euclidean norm value of the first region of the second k space as the weight of the second k space.

The image processor may interpolate the first unacquired line data by multiplying a ratio of the weight of the first k space to the weight of the second k space by the acquired line data of the second k space corresponding to the first unacquired line, and interpolate the second unacquired line data by multiplying a ratio of the weight of the second k space to the weight of the first k space by the acquired line data of the first k space corresponding to the second unacquired line.

The image processor may perform partial Fourier reconstruction on at least one of the interpolated first k space data and the interpolated second k space data.

The image processor may generate an MR parameter map based on the interpolated first k space data and the interpolated second k space data.

According to one or more exemplary embodiments, a method of operating an MRI apparatus includes: obtaining first k space data including a first unacquired line by undersampling an MR signal based on a first value of an MR parameter; obtaining second k space data including a second unacquired line by undersampling an MR signal based on a second value of the MR parameter; and interpolating at least a part of first unacquired line data in the first k space data based on the second k space data, and interpolating at least a part of second unacquired line data in the second k space data based on the first k space data.

The obtaining of the first k space data may include obtaining the first k space data including the first unacquired line in a second region by sampling an MR signal corresponding to a first region of a k space and an MR signal corresponding to a part of the second region of the k space, the obtaining of the second k space data may include obtaining the second k space data including the second unacquired line in the second region by sampling the MR signal corresponding to the first region and the MR signal corresponding to the part of the second region, and the interpolating may include interpolating the first unacquired line data based on acquired line data of a second k space corresponding to the first unacquired line, and interpolating the second unacquired line data based on acquired line data of a first k space corresponding to the second unacquired line.

The interpolating may include interpolating the first unacquired line data and the second unacquired line data based on a weight of the first k space and a weight of the second k space.

The interpolating may include calculating the weight of the first k space based on data of the first region of the first k space, and calculating the weight of the second k space based on data of the first region of the second k space.

The calculating may include calculating a Euclidean norm value of the first region of the first k space as the weight of the first k space, and calculating a Euclidean norm value of the first region of the second k space as the weight of the second k space.

The interpolating may include interpolating the first unacquired line data by multiplying a ratio of the weight of the first k space to the weight of the second k space by the acquired line data of the second k space corresponding to the first unacquired line, and interpolating the second unacquired line data by multiplying a ratio of the weight of the second k space to the weight of the first k space by the acquired line data of the first k space corresponding to the second unacquired line.

The method may further include performing partial Fourier reconstruction on at least one of the interpolated first k space data and the interpolated second k space data.

The method may further include generating an MR parameter map based on the interpolated first k space data and the interpolated second k space data.

BRIEF DESCRIPTION OF THE DRAWINGS

The above and/or other aspects will become more apparent by describing certain exemplary embodiments, with reference to the accompanying drawings, in which:

FIG. 3 is a block diagram of an MRI apparatus according to an exemplary embodiment;

FIG. 4 is a flowchart illustrating a method of operating an MRI apparatus, according to an exemplary embodiment;

DETAILED DESCRIPTION

Figure 1:
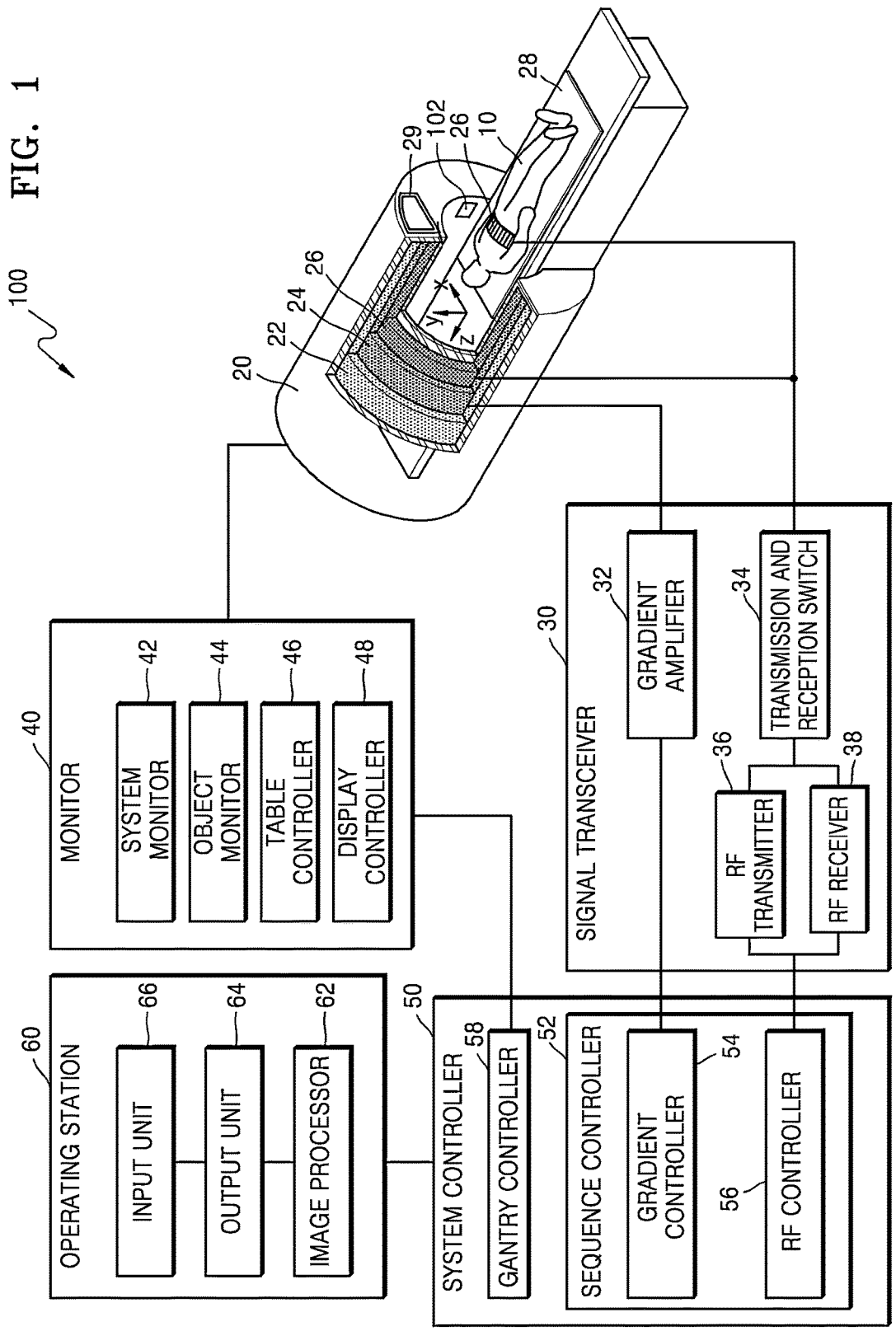
FIG. 1 is a block diagram of an MRI apparatus according to an exemplary embodiment.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

When something "includes" a component, another component may be further included unless specified otherwise. The term "unit" used in the present specification refers to a software component or a hardware component such as FPGA or ASIC, and performs a certain function. However, the "unit" is not limited to software or hardware. The "unit" may be configured in an addressable storage medium and may be configured to be executed by one or more processors. Hence, the "unit" includes elements such as software elements, object-oriented software elements, class elements, and task elements, and processes, functions, attributes, procedures, sub-routines, segments of program codes, drivers, firmware, micro-codes, circuits, data, databases, data structures, tables, arrays, and variables. The functions provided in the elements and the units may be combined into a fewer number of elements and units or may be divided into a larger number of elements and units.

As used herein, the term "and/or" includes any and all combinations of one or more of the associated listed items. Expressions such as "at least one of," when preceding a list of elements, modify the entire list of elements and do not modify the individual elements of the list.

In the present specification, "image" may refer to multi-dimensional data composed of discrete image elements (e.g., pixels in a two-dimensional image and voxels in a three-dimensional image). For example, an image may include a medical image of an object acquired by using an X-ray, CT, MRI, ultrasound, etc.

An "object" may be a person or an animal, or a part of a person or an animal. For example, the object may be a liver, heart, womb, brain, breast, abdomen, or blood vessel. Furthermore, the "object" may be a phantom. The phantom means a material having a volume that has approximately the intensity and effective atomic number of a living thing, and may be a sphere phantom having a property similar to the human body.

A "user" refers to a medical professional, such as a doctor, a nurse, a medical laboratory technologist, and an engineer who repairs a medical apparatus, but the user is not limited thereto.

An "MRI" refers to an image of an object obtained by using the nuclear magnetic resonance principle.

A "pulse sequence" refers to continuity of signals repeatedly applied by an MRI apparatus. A pulse sequence may include a time parameter of a radio frequency (RF) pulse, for example, repetition time (TR) or echo time (TE).

An MRI system is an apparatus for acquiring a sectional image of a part of an object by expressing, via a contrast comparison, a strength of an MR signal with respect to a radio frequency (RF) signal generated in a magnetic field having a specific strength. For example, if an RF signal that resonates only a specific atomic nucleus (for example, a hydrogen atomic nucleus) is transmitted for an instant onto the object that is placed in a strong magnetic field and then the transmission stops, an MR signal is emitted from the specific atomic nucleus, and thus, the MRI system may receive the MR signal and acquire an MR image. The MR signal denotes an RF signal emitted from the object. An intensity of the MR signal may be determined according to a density of a predetermined atom (for example, hydrogen) included in the object, a relaxation time T1, a relaxation time T2, and a blood flow.

FIG. 1 is a block diagram of an MRI apparatus 100 according to an exemplary embodiment.

Referring to FIG. 1, the MRI apparatus may include a gantry 20, a signal transceiver 30, a monitor 40, a system controller 50, and an operating station 60.

The system controller 50 may include a sequence controller 52 for controlling a sequence of signals formed in the gantry 20, and a gantry controller 58 for controlling the gantry 20 and devices mounted on the gantry 20.

The sequence controller 52 may include the gradient controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating station 60. The pulse sequence includes information required to control the gradient amplifier 32, the RF transmitter 36, the RF receiver 38, and the transmission and reception switch 34, as for example, information about strength, an application time, and an application timing of a pulse signal applied to the gradient coil 24.

The gantry 20 blocks electromagnetic waves generated by a main magnet 22, a gradient coil 24, and an RF coil 26 from being transmitted to the outside. A magnetostatic field and a gradient magnetic field are formed in a bore of the gantry 20, and an RF signal is transmitted towards an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being moved into a cylinder along a horizontal axis of the cylinder.

The main magnet 22 generates a magnetostatic field for aligning a direction of magnetic dipole moments of atomic nuclei in the object 10 in a constant direction. A precise and accurate MR image of the object 10 may be obtained when a magnetic field generated by the main magnet 22 is strong and uniform.

The gradient coil 24 includes X, Y, and Z coils for generating magnetic field gradients in X-, Y-, and Z-axis directions crossing each other at right angles. The gradient coil 24 may provide location information of each region of the object 10 by differently inducing resonance frequencies according to the regions of the object 10.

The RF coil 26 may transmit an RF signal toward the object 10 and receive an MR signal emitted from the object 10. For example, the RF coil 26 may transmit an RF signal at a same frequency as precessional motion to the object 10 towards atomic nuclei in precessional motion, stop transmitting the RF signal, and then receive an MR signal emitted from the object 10.

For example, in order to transit an atomic nucleus from a low energy state to a high energy state, the RF coil 26 may generate and apply an electromagnetic wave signal having an RF corresponding to a type of the atomic nucleus, for example, an RF signal, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus on which the electromagnetic waves were applied transits from the high energy state to the low energy state, thereby emitting electromagnetic waves having a Larmor frequency. In other words, when application of the electromagnetic wave signal to the atomic nucleus is stopped, an energy level of the atomic nucleus is changed from a high energy level to a low energy level, and thus the atomic nucleus may emit electromagnetic waves having a Larmor frequency. The RF coil 26 may receive electromagnetic wave signals from atomic nuclei in the object 10.

The RF coil 26 may be implemented as one RF transmit and receive coil having both a function of generating electromagnetic waves having a wireless frequency corresponding to a type of an atomic nucleus and a function of receiving electromagnetic waves emitted from an atomic nucleus. Alternatively, the RF coil 26 may be a RF transmit coil having a function of generating electromagnetic waves having a wireless frequency corresponding to a type of an atomic nucleus, and an RF receive coil having a function of receiving electromagnetic waves emitted from an atomic nucleus.

Thus, the RF coil 26 may be a transmit only coil, a receive only coil, or a transmit and receive coil according to methods of transmitting and receiving an RF signal.

The RF coil 26 may have a number of channels, such as 16 channels, 32 channels, 72 channels, and 144 channels.

The RF coil 26 may be fixed to the gantry 20 or may be detachable. When the RF coil 26 is detachable, the RF coil 26 may be an RF coil for an area of the object 10, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil.

The gantry 20 may further include a display 29 disposed outside the gantry 20 and a display 102 disposed inside the gantry 20. The gantry 20 may provide predetermined information to the user or the object through the display 29 and the display 102 respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal, respectively.

The signal transceiver 30 may include a gradient amplifier 32, a transmission and reception switch 34, an RF transmitter 36, and an RF receiver 38.

The gradient amplifier 32 drives the gradient coil 24 in the gantry 20, and may supply a pulse signal for generating a magnetic field gradient to the gradient coil 24 according to control of a gradient controller 54. By controlling the pulse signal supplied from the gradient amplifier 32 to the gradient coil 24, magnetic field gradients in X-, Y-, and Z-axis directions may be generated.

The RF transmitter 36 may supply an RF pulse with a Larmor frequency to the RF coil 26, and the RF receiver 38 may receive an MR signal received by the RF coil 26.

The transmission and reception switch 34 may adjust transmitting and receiving directions of the RF signal and the MR signal. For example, the RF signal may be transmitted to the object 10 through the RF coil 26 during a transmission mode, and the MR signal may be received from the object 10 through the RF coil 26 during a reception mode. The transmission and reception switch 34 may be controlled by a control signal from an RF controller 56.

The monitor 40 may monitor or control the gantry 20 or devices mounted on the gantry 20. The monitor 40 may include a system monitor 42, an object monitor 44, a table controller 46, and a display controller 48.

The system monitor 42 may monitor and control a state of a magnetostatic field, a state of a gradient magnetic field, a state of an RF signal, a state of an RF coil, a state of a table, a state of a device measuring body information of an object, a power supply state, a state of a thermal exchanger, and a state of a compressor.

The object monitor 44 monitors a state of the object 10. For example, the object monitor 44 may include a camera for observing a movement or position of the object 10, a respiration measurer for measuring the respiration of the object 10, an ECG measurer for measuring ECG of the object 10, or a temperature measurer for measuring a temperature of the object 10.

The table controller 46 controls a movement of the table 28 where the object 10 is positioned. The table controller 46 may control the movement of the table 28 according to sequence control of a sequence controller 52. For example, during imaging of the object 10 on a moving table, the table controller 46 may continuously or discontinuously move the table 28 according to the sequence control of the sequence controller 52, and thus the object 10 may be imaged in a field of view (FOV) larger than that of the gantry 20.

The display controller 48 controls the display 29 and the display 102 respectively outside and inside the gantry 20. For example, the display controller 48 may turn on or off the display 29 and the display 102, and may control a screen to be output on the display 29 and/or the display 102. Also, when a speaker is located inside or outside the gantry 20, the display controller 48 may turn on or off the speaker or control the speaker to output sound.

The operating station 60 requests the system controller 50 to transmit pulse sequence information while controlling an overall operation of the MRI apparatus 100.

The operating station 60 may include an image processor 62 for processing an MR signal received from the RF receiver 38, an output unit 64, and an input unit 66.

The image processor 62 processes an MR signal received from the RF receiver 38 to generate MR image data of the object 10.

The image processor 62 performs any one of various signal processes, such as amplification, frequency conversion, phase detection, low frequency amplification, and filtering, on an MR signal received by the RF receiver 38.

The image processor 62 may arrange digital data in a k space (also referred to as a Fourier space or frequency space) of a memory, and reconstruct the digital data into image data via 2D or 3D Fourier transform.

A k space denotes a set of raw data about an MR signal, and may include location information and contrast information.

Digital data arranged in a k space may be undersampled data. Accordingly, some lines of the k space may be empty without data.

The image processor 62 may perform a composition process or difference calculation process on image data. The composition process may include an addition process on a pixel or a maximum intensity projection (MIP) process. The image processor 62 may store reconstructed image data and/or image data on which a composition process or difference calculation process is performed, in a memory (not shown) or in an external server.

Signal processes applied to MR signals by the image processor 62 may be performed in parallel. For example, a signal process may be performed on a plurality of MR signals received by a multi-channel RF coil in parallel to reconstruct the plurality of MR signals as image data.

The output unit 64 may output image data generated or reconstructed by the image processor 62 to the user. The output unit 64 may output information required for the user to manipulate the MRI system, such as user interface (UI), user information, or object information. The output unit 64 may include a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a PFD display, a 3D display, a transparent display, or any other appropriate output device known to those of ordinary skill in the art.

The user may input object information, parameter information, a scan condition, a pulse sequence, or information about image composition or difference calculation by using the input unit 66. The input unit 66 may include a keyboard, a mouse, a trackball, a voice recognizer, a gesture recognizer, a touch screen, or any other appropriate input device known to those skilled in the art.

Although signal transceiver 30, the monitor 40, the system controller 50, and the operating station 60 are shown and described as separate components in FIG. 1, some or all of these components may be implemented as a single component. Also, some or all of the functions of the signal transceiver 30, the monitor 40, the system controller 50, and the operating station 60 may be performed by another component or integrated in one component. For example, the image processor 62 converts an MR signal received by the RF receiver 38 into a digital signal, but such a conversion to a digital signal may be directly performed by the RF receiver 38 or the RF coil 26.

The gantry 20, the RF coil 26, the signal transceiver 30, the monitor 40, the system controller 50, and the operating station 60 may be connected to each other via wires or wirelessly. When they are connected wirelessly, the MRI system may further include an apparatus (not shown) for synchronizing clocks therebetween. Communication between the gantry 20, the RF coil 26, the signal transceiver 30, the monitor 40, the system controller 50, and the operating station 60 may be performed by using a high-speed digital interface, such as low voltage differential signaling (LVDS), asynchronous serial communication, such as universal asynchronous receiver transmitter (UART), a low-delay network protocol, such as an error synchronous serial communication or controller area network (CAN), optical communication, or any other appropriate communication method known to those skilled in the art.

Figure 2:
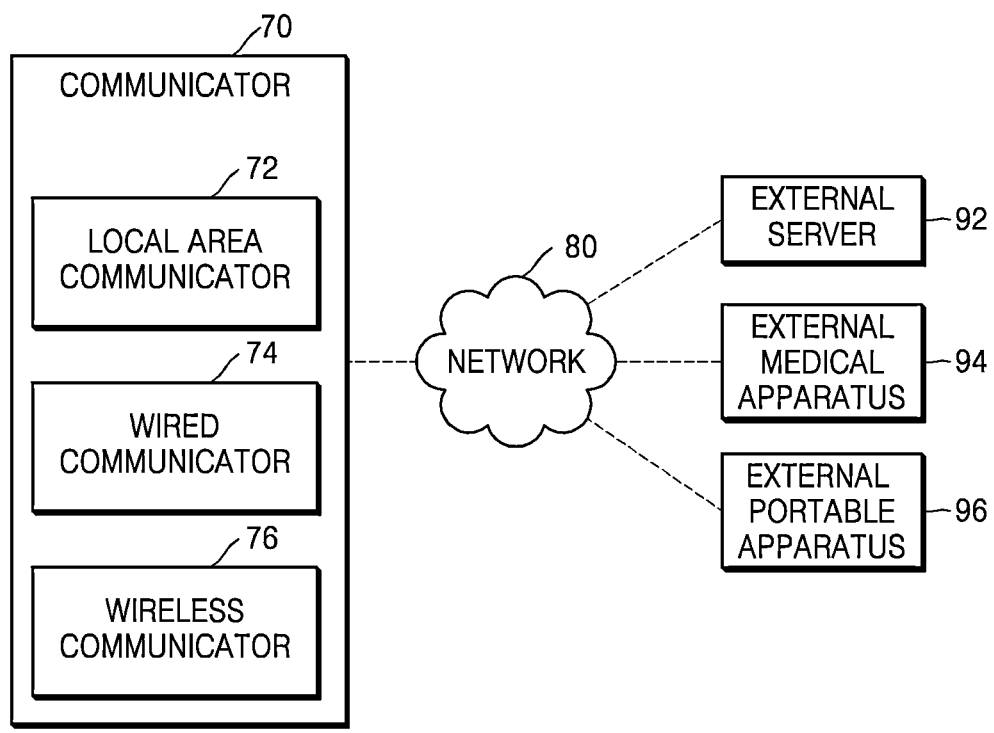
FIG. 2 is a block diagram of a communicator according to an exemplary embodiment.

FIG. 2 is a block diagram of a communicator 70 according to an exemplary embodiment. The communicator 70 may be incorporated into the MRI system 100 or may be connected to the MRI system 100 via a network. For example, the communicator 70 may be connected to at least one of the gantry 20, the signal transceiver 30, the monitor 40, the system controller 50, and the operating station 60.

The communicator 70 may transmit and receive data to and from a hospital server or another medical apparatus placed in a hospital connected thereto through a picture archiving and communication system (PACS), and perform data communication according to the digital imaging and communications in medicine (DICOM) standard.

As shown in FIG. 2, the communicator 70 may be connected to a network 80 via wires or wirelessly to communicate with an external server 92, an external medical apparatus 94, and/or an external portable apparatus 96.

For example, the communicator 70 may transmit and receive data related to the diagnosis of an object through the network 80, and may also transmit and receive a medical image captured by the external medical apparatus 94, such as a CT, an MRI, or an X-ray apparatus. The communicator 70 may receive a medical history or a treatment schedule of the object from the external server 92 to diagnose the object. The communicator 70 may perform data communication not only with the external server 92 or external medical apparatus 94 in a hospital, but also with the external portable apparatus 96, such as a mobile phone, a personal digital assistant (PDA), or a laptop of a doctor or customer.

The communicator 70 may transmit information about malfunction of the MRI system or about a medical image quality to a user through the network 80, and receive feedback from the user.

The communicator 70 may include at least one component enabling communication with an external apparatus, for example, a local area communicator 72, a wired communicator 74, and a wireless communicator 76.

The local area communicator 72 is a module for performing local area communication with a device within a predetermined distance. Examples of a local area communication technology include a wireless local area network (LAN), Wi-Fi, Bluetooth, Zigbee, Wi-Fi direct (WFD), ultra wideband (UWB), infrared data association (IrDA), Bluetooth low energy (BLE), and near field communication (NFC), but this is not limiting.

The wired communicator 74 is a module for performing communication by using an electric signal or an optical signal. Examples of a wired communication technology include using a pair cable, a coaxial cable, an optical fiber cable, and other appropriate wired communication technologies known to those skilled in the art.

The wireless communicator 76 transmits and receives a wireless signal to and from at least one of a base station, an external apparatus, and a server in a mobile communication network. The wireless signal may include data in any one of various formats according to transmitting and receiving a voice call signal, a video call signal, and a text/multimedia message.

FIG. 3 is a block diagram of an MRI apparatus 200 according to an exemplary embodiment. The MRI apparatus 200 may be incorporated into the MRI system 100 or may be separate from the MRI system 100 and may communicate with the MRI system 100 via a network.

Referring to FIG. 3, the MRI apparatus 200 may include a data processor 210 and an image processor 220.

The data processor 210 of FIG. 3 may correspond to the RF receiver 38 or operating station 60 of FIG. 1, and the image processor 220 of FIG. 3 may correspond to the image processor 62 of FIG. 1.

The data processor 210 may obtain a data set having different MR parameter values in order to generate an MR parameter map. The MR parameter map may include a T1 map, a T2 map, and a T2 emphasis map, and the image processor 220 may form the MR parameter map based on the obtained data set. In order to form the MR parameter map, MR parameter values, such as repetition time TR, flip angle (FA), and inversion time (TI), may be differently set to obtain the data set. The data set may be an undersampled data set, and may be k space data.

For example, the data processor 210 may obtain first k space data by undersampling an MR signal based on a first value of an MR parameter, and obtain second k space data by undersampling the MR signal based on a second value of the MR parameter. A sampling rate of a k space with respect to a first region may be set to be higher than a sampling rate of the k space with respect to a second region to obtain the k space data. Accordingly, a density of acquired line data of the second region may be smaller than a density of acquired line data of the first region.

The data processor 210 may perform full-sampling on an MR signal corresponding to the first region of the k space and perform undersampling on an MR signal corresponding to the second region to obtain k space data including an unacquired line in the second region.

The image processor 220 may interpolate data of an unacquired line that is not sampled based on the data set obtained by the data processor 210.

For example, unacquired line data of a first k space that is undersampled and includes an unacquired line may be interpolated by using acquired line data of the first k space or acquired line data of a second k space obtained by differently setting an MR parameter value.

The unacquired line data in the first region of the first k space may be interpolated by using the acquired line data of the first k space, by using any one of various methods, such as, for example, a compression sensing method. The unacquired line data in the second region of the first k space may be interpolated by using the acquired line data of the second k space.

The image processor 220 may calculate weights of a plurality of k spaces, and interpolate unacquired line data by applying the calculated weights.

An MR image may be generated by performing partial Fourier reconstruction based on the interpolated k space data.

FIG. 4 is a flowchart illustrating a method of operating the MRI apparatus 200, according to an exemplary embodiment.

Referring to FIG. 4, the MRI apparatus 200 may obtain first k space data including a first unacquired line by undersampling an MR signal based on a first value of an MR parameter, in operation S310.

For example, the MRI apparatus 200 may set an MR parameter as a first value, and then full-sample an MR signal corresponding to first region data of a k space and undersample an MR signal corresponding to second region data to obtain a first k space. Accordingly, the first k space may include a first unacquired line data where an MR signal is not measured in a second region.

Then, the MRI apparatus 200 may obtain second k space data including a second unacquired line by undersampling an MR signal based on a second value of an MR parameter, in operation S320.

For example, the MRI apparatus 200 may set an MR parameter as a second value, and full-sample an MR signal corresponding to first region data of a k space and under-sample an MR signal corresponding to second region data to obtain a second k space. Accordingly, the second k space may include a second unacquired line data where an MR signal is not measured in a second region.

The MRI apparatus 200 may interpolate first unacquired line data based on the second k space data and interpolate second unacquired line data based on the first k space data, in operation S330.

For example, the first unacquired line data in the second region of the first k space may be interpolated based on acquired line data of the second k space corresponding to the first unacquired line data. The second unacquired line data in the second region of the second k space may be interpolated based on acquired line data of the first k space corresponding to the second unacquired line data.

The method of FIG. 4 is described in detail below with reference to FIGS. 5 through 13.

Figure 5A:
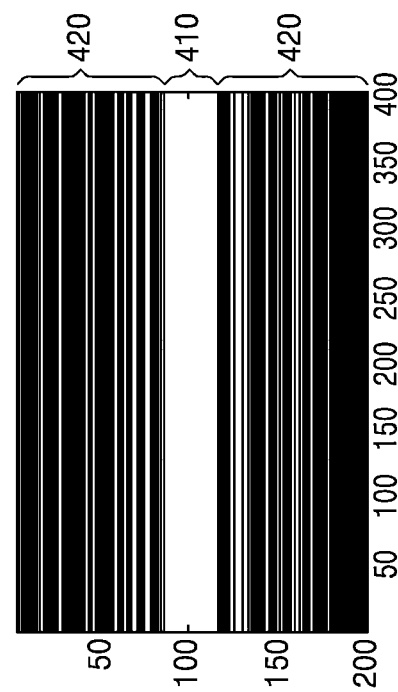
FIGS. 5A and 5B are diagrams for describing a method of sharing data in under-sampled k spaces, according to exemplary embodiments.
Figure 5B:
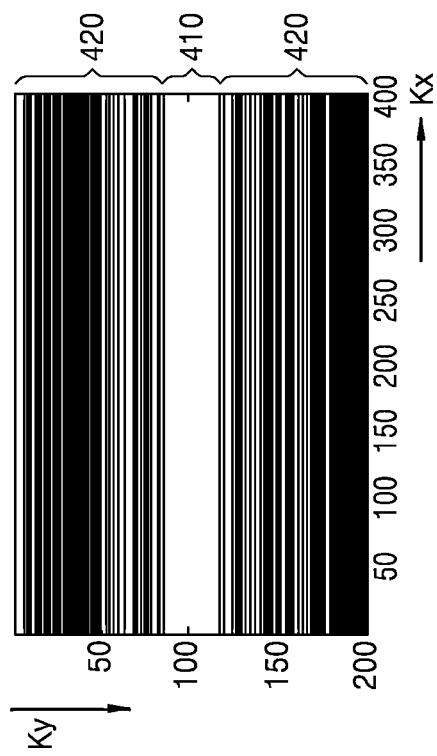
Figure 6:
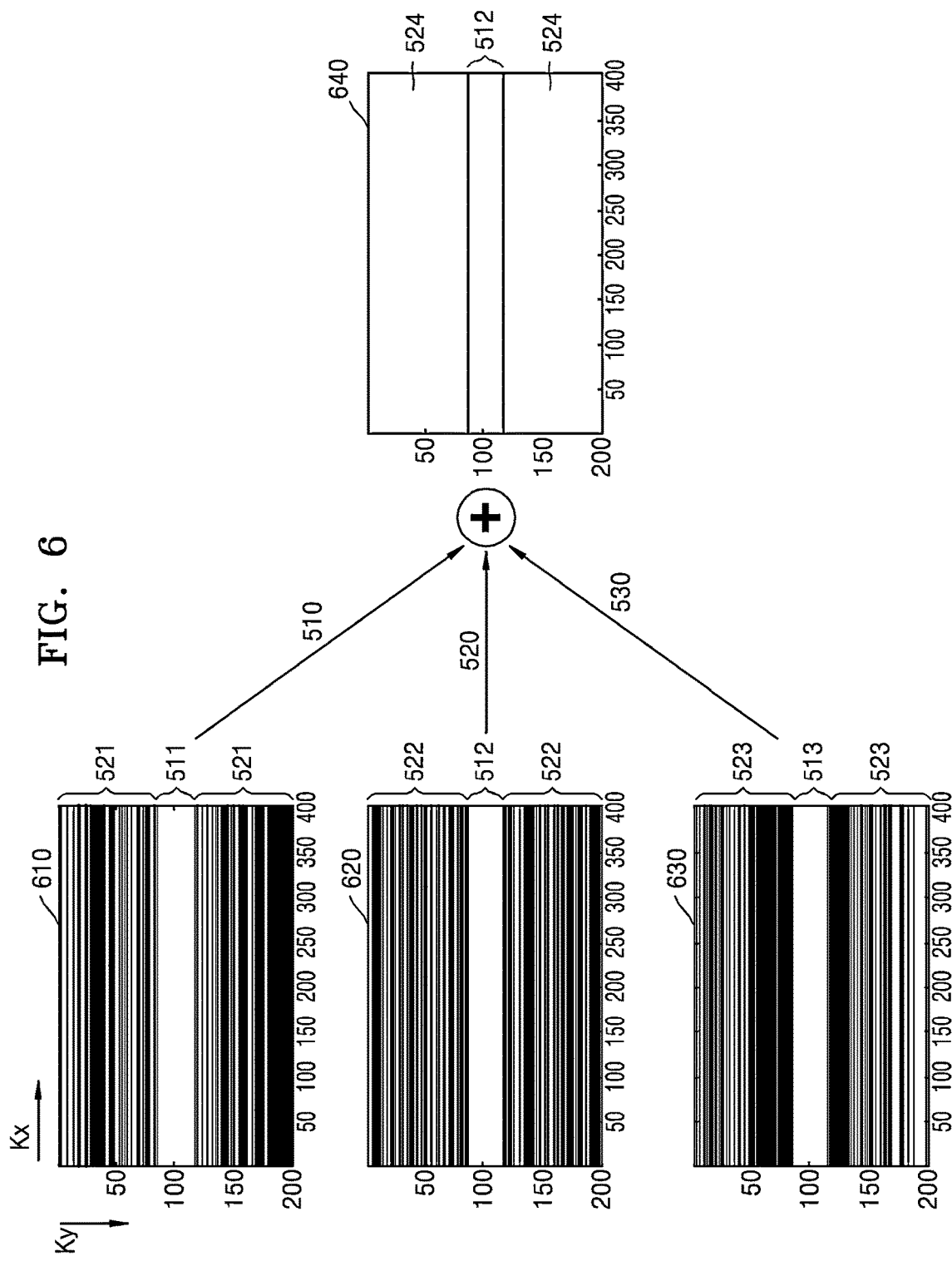
FIG. 6 shows diagrams for describing a method of sharing data in undersampled k spaces, according to exemplary embodiments.

FIGS. 5 and 6 are diagrams for describing a method of sharing data in undersampled k spaces, according to exemplary embodiments.

FIG. 5A shows a first k space undersampled based on a first value of an MR parameter, and FIG. 5B shows a second k space undersampled based on a second value of an MR parameter. For example, the first k space may be a k space where MR signal data is obtained by setting a repetition time TR as a first value, and the second k space may be a k space where MR signal data is obtained by setting a TR as a second value. The repetition time TR is the time from the application of an excitation pulse to the application of the next pulse. It determines how much longitudinal magnetization recovers between each pulse and is measured in milliseconds.

Alternatively, the first k space may be a k space where MR signal data is obtained by setting an FA as a first value, and the second k space may be a k space where MR signal data is obtained by setting an FA as a second value. Alternatively, the first k space may be a k space where MR signal data is obtained by setting a TI as a first value, and the second k space may be a k space where MR signal data is obtained by setting a TI as a second value. However, the first and second k spaces are not limited thereto, and may include k spaces where MR signal data is obtained by setting MR parameters other than TR, FA, and TI, in different values. Hereinafter, for convenience of description, a TR is used as an MR parameter.

An x-axis (kx-axis) of a k space denotes a frequency encoding direction, and a y-axis (ky-axis) denotes a phase encoding direction. For example, the first and second k spaces shown in FIGS. 5A and 5B include 200 lines in the ky-axis and 400 lines in the kx-axis. Also, white regions in FIGS. 5A and 5B indicate lines that are sampled and whose MR signals are measured (hereinafter, referred to as acquired lines), and black regions indicate lines that are not sampled and whose MR signals are not measured (hereinafter, referred to as unacquired lines).

Referring to FIGS. 5A and 5B, the first k space in FIG. 5A and the second k space in FIG. 5B may each include a first region 410 and a second region or regions 420. The first region 410 may only include acquired lines whose data is obtained. In other words, the MRI apparatus 200 may full-sample an MR signal with respect to the first region 410 to obtain full data corresponding to the first region 410.

The first region 410 may be a central region of the first or second k space, and may be an ACS region. The first region 410 may include at least one line, and the number of lines included in the first region 410 may be preset.

The second region 420 may include unacquired lines (black lines) whose data is not sampled. In other words, the MRI apparatus 200 may under-sample an MR signal with respect to the second region 420 to obtain data corresponding to apart of the second region 420.

As described above, the MRI apparatus 200 obtains data by full-sampling only the first region 410 and obtains data by undersampling the second region 420, thereby reducing time for obtaining data of the k space.

Unacquired line data that is not sampled in a second region of a k space may be interpolated by using acquired line data that is sampled in a second region of another k space.

For example, data of unacquired lines of the first k space, which are shown in black lines in FIG. 5A, may be interpolated by using data of acquired lines of the second k space, which are shown in white lines in FIG. 5B and correspond to the unacquired lines of the first k space. Also, data of unacquired lines of the second k space, which are shown in black lines in FIG. 5B, may be interpolated by using data of acquired lines of the first k space, which are shown in white lines in FIG. 5A and correspond to the unacquired lines of the second k space.

By interpolating unacquired line data of a first k space by using corresponding acquired line data of a second k space, a second region of the first k space may be filled with full data, and by interpolating unacquired line data of the second k space by using acquired line data of the first k space, a second region of the second k space may be filled with full data.

Accordingly, compared to the case when all regions of the first and second k spaces are full-sampled, time taken for obtaining data of the first and second k spaces may be reduced in the present exemplary embodiment, and a quality of a restored MR image may be maintained.

FIG. 6 shows a first k space 610 undersampled based on a first value of an MR parameter, a second k space 620 undersampled based on a second value of an MR parameter, and a third k space 630 undersampled based on a third value of an MR parameter. For example, the first k space 610 may be a k space where MR signal data is obtained by setting a first TR, the second k space 620 may be a k space where MR signal data is obtained by setting a second TR, and the third k space 630 may be a k space where MR signal data is obtained by setting a third TR.

FIG. 6 shows an interpolated second k space 640 in which unacquired line data is interpolated by using the first k space data and third k space data.

Referring to FIG. 6, first regions 511, 512, and 513 of the first through third k spaces 610, 620, and 630 may only include acquired lines where data is obtained. In other words, the MRI apparatus 200 may full-sample MR signals corresponding to the first regions 511 through 513 to obtain full data of the first regions 511 through 513.

The second regions 521, 522, and 523 of the first through third k spaces 610, 620, and 630 may include unacquired lines whose MR signal data is not sampled. The number of unacquired lines may be at least one, and at least one of lines of the first and third k spaces 610 and 630 corresponding to an unacquired line of the second k space 620 may be an acquired line whose data is obtained. For example, when an n-th line of the second k space 620 is an unacquired line, at least one of an n-th line of the first k space 610 and an n-th line of the third k space 630 may be an acquired line whose data is obtained.

Accordingly, unacquired line data of the second k space 620 may be interpolated by using corresponding acquired line data of the first or third k space 610, 630. In other words, data of unacquired lines in the second region 522 of the second k space 620 may be interpolated by using data of corresponding acquired lines, which are shown in white lines of the first k space 610, as indicated by an arrow 510, and/or by using data of corresponding acquired lines, which are shown in white lines of the third k space 630, as indicated by an arrow 530. Accordingly, the MRI apparatus 200 may form the interpolated second region 524 of the second k space 640 including full data.

Figure 7:
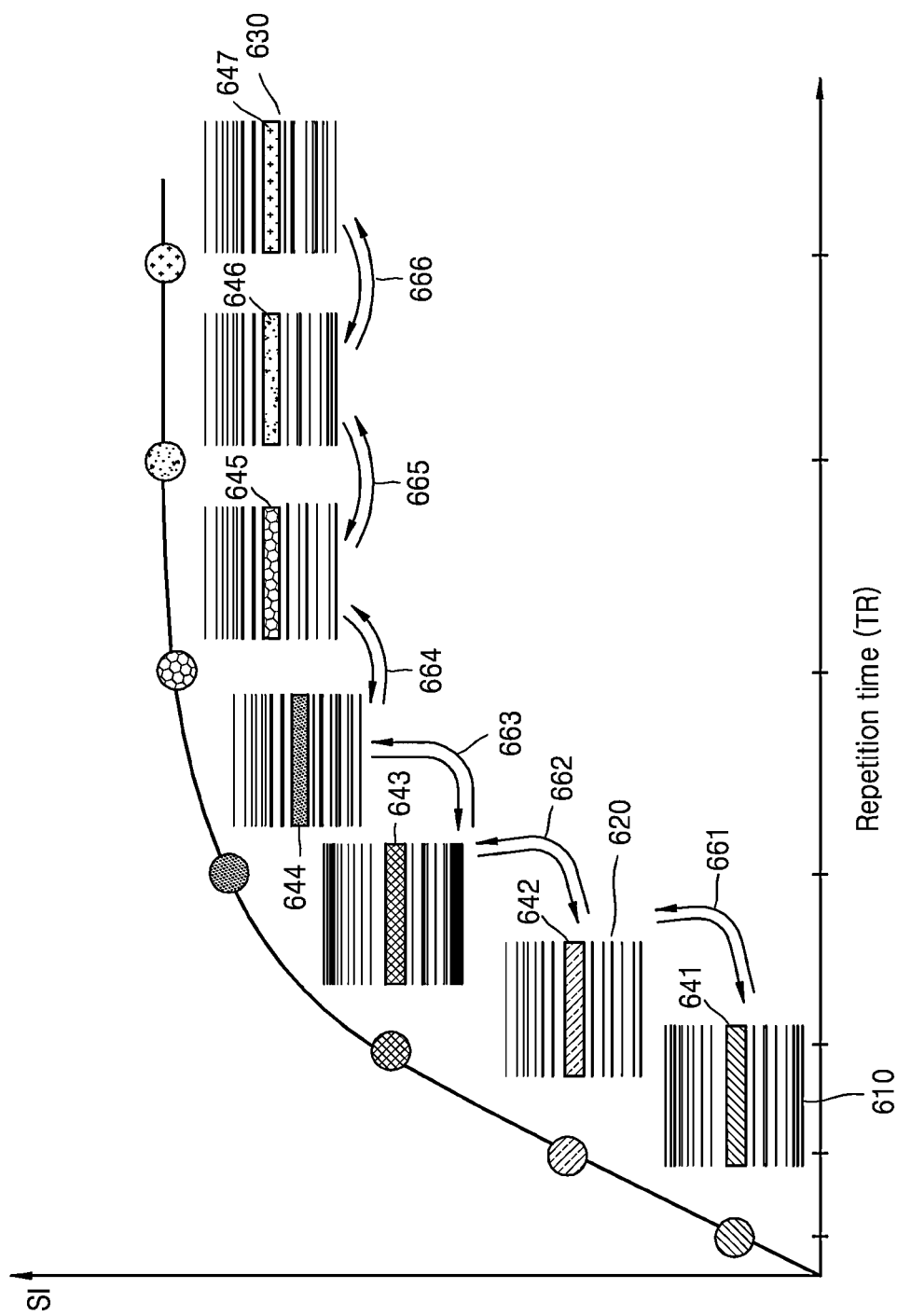
FIG. 7 is a graph of an intensity of an MR signal according to repetition time TR.

FIG. 7 is a graph of an intensity of a MR signal according to a repetition time TR as an MR parameter, expressed in unit of magnetic field strength SI, for example, tesla per meter. A plurality of k spaces shown in FIG. 7 are k spaces obtained at each point of a plot.

Referring to FIG. 7, first regions 641, 642, 643, 644, 645, 646, and 647 of the k spaces are fully sampled and only include acquired lines, second regions (regions excluding the respective first regions 641 through 647) include unacquired lines that are undersampled. The unacquired line data of the second regions may be shared between adjacent k spaces, as shown by arrows 661, 662, 663, 664, 665, and 666, to interpolate the unacquired line data.

If an n-th k space is restored by using data of an (n−1)-th k space and data of an (n+1)-th k space, and the number of lines included in the second region of the k space is m, a time of obtaining data may be reduced by obtaining data of only m/3 lines on average with respect to the second region of one k space.

In FIG. 7, the data of the adjacent (n−1)-th k space and the data of the (n+1)-th k space are used to interpolate unacquired line data of the n-th k space, but an exemplary embodiment is not limited thereto. For example, when the n-th k space is restored, unacquired line data of the n-th k space may be interpolated by using data of an (n−2)-th k space, the data of the (n−1)-th k space, the data of the (n+1)-th k space, and data of an (n+2)-th k space. As another example, a combination of non-adjacent k-spaces may be used.

Figure 8B:
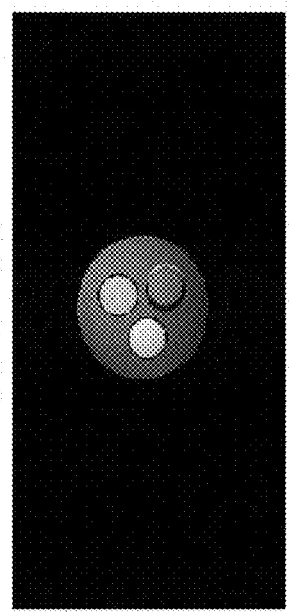
FIGS. 8A, 8B, 8C, 8D, and 8E are diagrams of MR images and k spaces, according to exemplary embodiments.
Figure 8D:
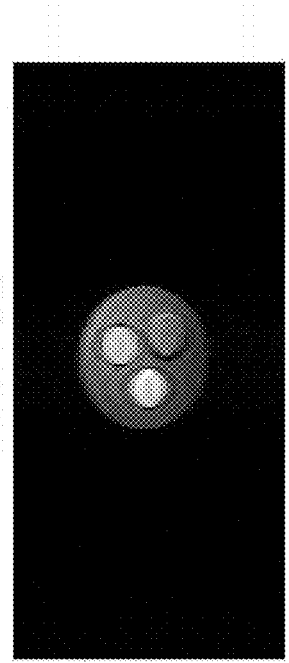
Figure 8A:
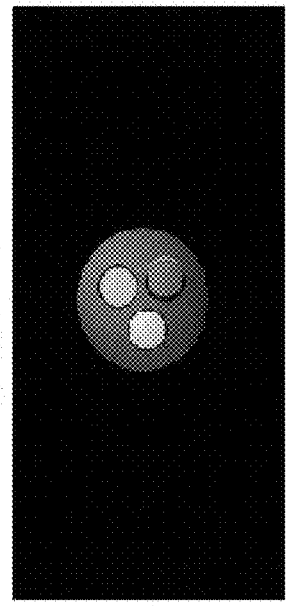
Figure 8C:
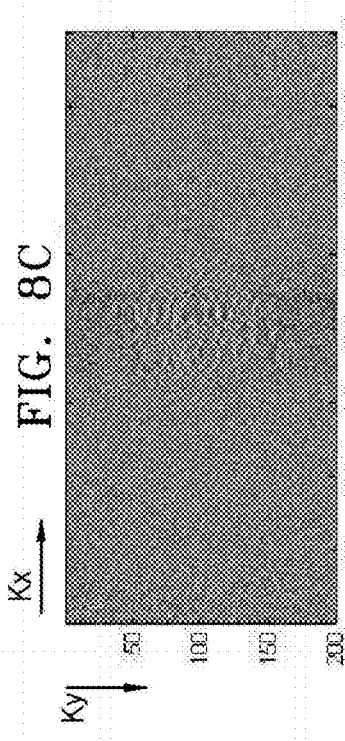
Figure 8E:
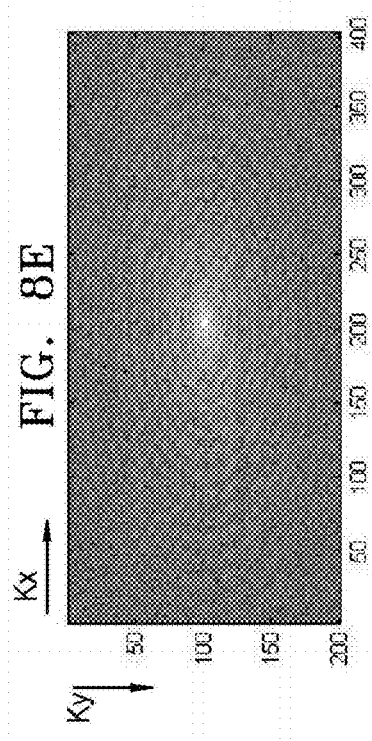

FIGS. 8A to 8E show diagrams of MR images and k spaces when a TR is set to 1000 ms, according to an exemplary embodiment. FIG. 8A shows an MR image generated by full-sampling an MR signal corresponding to a k space, FIG. 8B shows an MR image generated by interpolating unacquired line data of an undersampled k space according to an exemplary embodiment, FIG. 8C shows a difference image between the MR images of FIGS. 8A and 8B, FIG. 8D shows an MR image generated without interpolating the unacquired line data of the undersampled k space, and FIG. 8E shows a k space wherein the unacquired line data of the undersampled k space is interpolated according to an exemplary embodiment.

Referring to FIG. 8C, there is no substantial difference between the MR image generated by full-sampling the MR signal corresponding to the k space and the MR image generated by interpolating the unacquired line data of the undersampled k space.

In the method of sharing k space data according to an exemplary embodiment, the time taken for obtaining data may be reduced by undersampling one or more second regions. The quality of the MR image generated based in the k space interpolated according to the method of sharing k space data is substantially the same as a quality of an MR image generated by using full-sampled data.

Referring back to FIG. 6, unacquired line data of a second region 522 of a second k space 620 obtained by setting a TR to be 100 ms may be interpolated by using data of a first k space 610 obtained by setting a TR to be 50 ms and data of a third k space 630 obtained by setting a TR to be 2000 ms.

The data of the third k space 630 and the data of the second k space 620 may be discontinuous which may result in reduced quality of the generated MR image.

In other words, when a difference between values of MR parameters is large, the data may be discontinuous between adjacent k spaces. Thus, a weight may be applied to each k space to compensate for the discontinuity.

A weight of a k space may be calculated by using data arranged in a first region of the k space. For example, data in a central region of the k space may be used to calculate the weight. The data in the central region mainly includes low frequency components, and since a size of a signal does not largely change according to an MR parameter when the weight of the k space is calculated based on the data in the central region, accuracy of interpolated data may be increased.

For example, the weight of the k space may be calculated as a Euclidean (L2) norm value of data in the central region of the k space according to Equation 1:

$$W(k) = [x1^2 + x2^2 + x3^2 + \ldots + xn^2]^{0.5} \qquad \text{[Equation 1]}$$

Here, x1 through xn denote data in the central region of the k space.

Alternatively, an L2 norm value of data corresponding to a preset line in the central region of the k space may be set as the weight of the k space. The L2 norm value of the data of the preset line may be calculated according to Equation 1 above. The preset line may be a central line of the k space, but this is not limiting.

The calculated weight of the k space may be used to interpolate unacquired line data. For example, when W(k1) denotes a weight of a first k space, W(k2) denotes a weight of a second k space, and W(k3) denotes a weight of a third k space, unacquired line data of the second k space may be interpolated according to Equation 2:

$$X2 = [W(k2)/W(k1)] * X1$$

$$Y2 = [W(k2)/W(k3)] * Y3 \qquad \text{[Equation 2]}$$

Here, X2 and Y2 denotes the unacquired line data of the second k space. The unacquired line data X2 of the second k space may be calculated by multiplying a ratio of the weight of the second k space to the weight of the first k space by acquired line data X1 of the first k space corresponding to the unacquired line data X2.

The unacquired line data Y2 of the second k space may be calculated by multiplying a ratio of the weight of the second k space to the weight of the third k space by acquired line data Y3 of the third k space corresponding to the unacquired line data Y2.

Figure 9B:
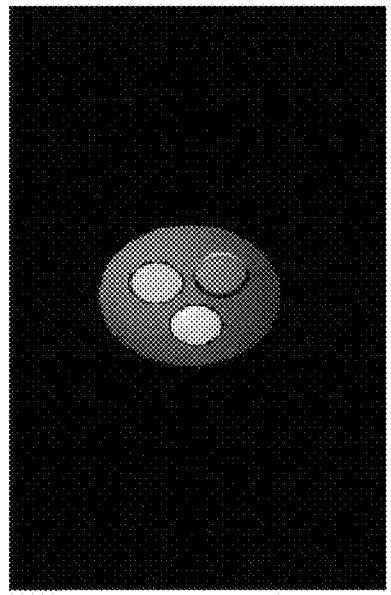
FIGS. 9A, 9B, 9C, and 9D are diagrams of MR images and k spaces, according to exemplary embodiments.
Figure 9D:
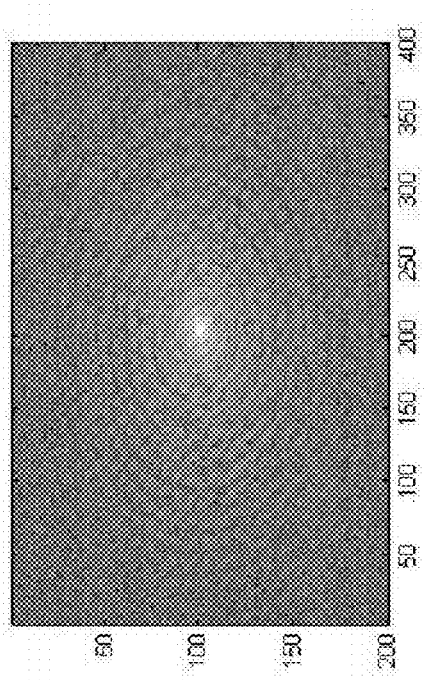
Figure 9A:
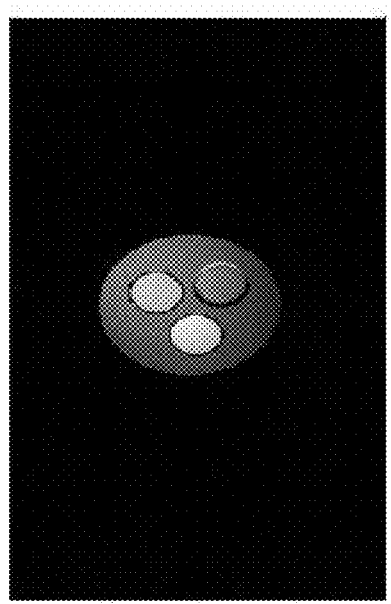
Figure 9C:
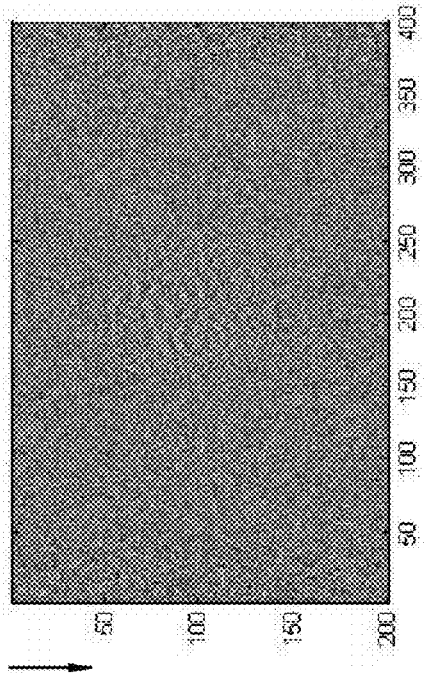

FIGS. 9A to 9D show diagrams of MR images and a k space when a TR is set to 1000 ms, according to an exemplary embodiment. FIG. 9A shows an MR image generated by full-sampling an MR signal corresponding to a k space, FIG. 9B shows an MR image generated by interpolating unacquired line data of an undersampled k space by applying a weight, according to an exemplary embodiment, FIG. 9C shows a difference image between the MR image of FIG. 9A and the MR image of FIG. 9B, and FIG. 9D shows a k space wherein the unacquired line data of the undersampled k space is interpolated by applying the weight, according to an exemplary embodiment.

Referring to FIG. 9C, there is no difference between the MR image generated by full-sampling the MR signal corresponding to the k space and the MR signal generated by interpolating the unacquired line data of the undersampled k space, according to an exemplary embodiment. Also, comparing FIG. 9C and FIG. 8C, it is determined that the MR image (FIG. 8A and FIG. 9A) generated by full-sampling the MR signal corresponding to the k space is more similar to the MR image generated by interpolating the data by applying the weight than the MR image generated by interpolating the data by not applying the weight.

Figure 10:
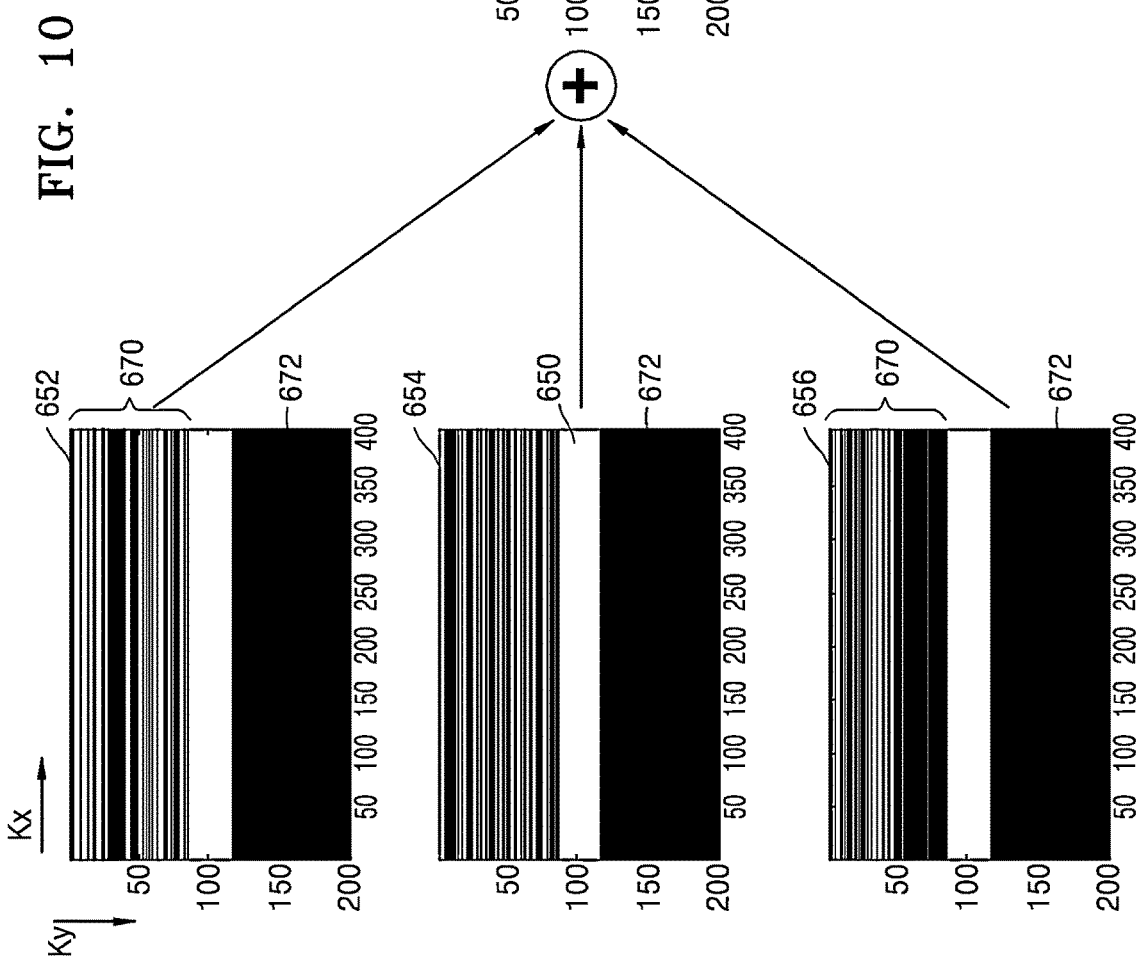
FIG. 10 is a diagram for describing an example of applying a method of sharing data to obtaining partial data of a k space, according to an exemplary embodiment.

FIG. 10 is a diagram for describing an example of applying an exemplary method of interpolating unacquired line data to obtaining partial data of a k space, according to an exemplary embodiment.

For example, the exemplary method of sharing data may be used in a partial Fourier reconstruction.

In the partial Fourier reconstruction, partial data is obtained without having to obtain data corresponding to an entire k space by using a symmetrical characteristic of k space data, and remaining data of the k space is estimated based on the obtained partial data. For example, the k space may be symmetrically disposed with respect to a ky-axis.

For example, when m lines are disposed in the k space in a ky-axis, i.e., in a phase encoding direction, and n lines are set in an ACS region 650, an MRI apparatus may obtain MR signal data corresponding to (m/2+n/2) lines to perform partial Fourier reconstruction, thereby generating an MR image.

When the method of sharing data according to an exemplary embodiment is applied, data of some lines is obtained without having to obtain data of all of (m/2+n/2) lines in one k space, and unacquired line data is interpolated by using acquired line data of another k space, thereby obtaining the data of the (m/2+n/2) lines.

For example, as shown in FIG. 10, when the k space has 200 lines in the ky-axis and lines set in the ACS region 650 are 81th to 120th lines, partial Fourier reconstruction may be performed by using data of first through 120th lines of a first peripheral sub-region 670 and the ACS region 650. Signal values corresponding to 121st to 200th lines in a second peripheral sub-region 672 are not sampled, and the 121st to 200th lines may be estimated by using acquired line data of the first to 120th lines, and thus a time for obtaining the final k space may be reduced.

In obtaining data of first through 120th lines of a plurality of k spaces, 81st to 120th lines set as an ACS region are full-sampled, first to 80th lines are undersampled, and 121st to 200th lines are not sampled with respect to each of the plurality of k spaces, in an exemplary embodiment.

Also, unacquired line data of first through 80th lines of a k space may be interpolated by using acquired line data of another k space.

For example, unacquired line data of first through 80th lines of a second k space 654 may be interpolated by using acquired line data of undersampled data of first through 80th lines of first and third k spaces 652 and 656.

Accordingly, as shown in FIG. 10, all of first through 120th lines of the interpolated second k space 658 include data.

Figure 11:
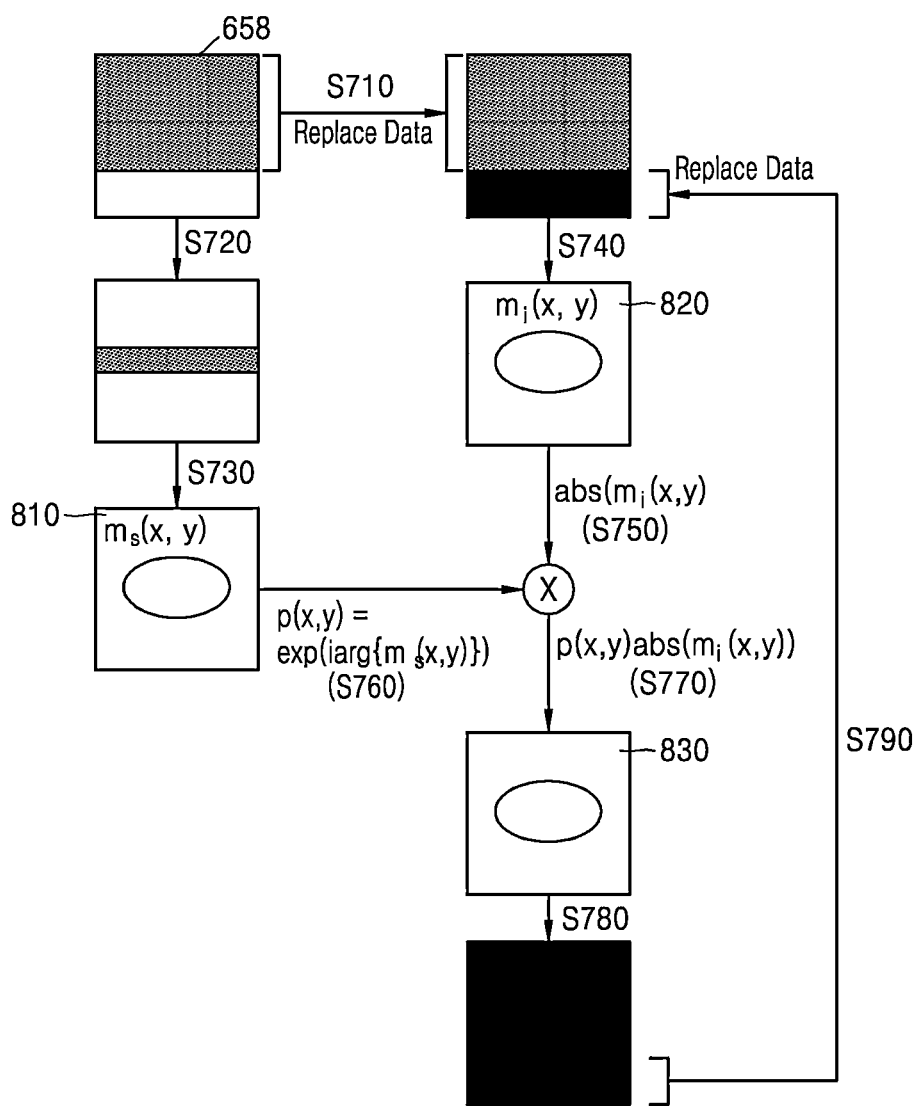
FIG. 11 is a diagram showing processes of obtaining full data of the k space by applying a partial Fourier reconstruction method to the partial data of the k space in FIG. 10.

FIG. 11 is a diagram showing processes of obtaining full data of the k space by applying a partial Fourier reconstruction method to the partial data of the k space in FIG. 10.

FIG. 11 is a diagram for describing a projection onto convex sets (POCS) method as an example of the partial Fourier reconstruction method. In the present exemplary embodiment, the partial data of the k space obtained by using the method of sharing data according to an exemplary embodiment is applied to the POCS method to perform the partial Fourier reconstruction. However, an exemplary embodiment is not limited thereto and the partial data of the k space may be used with other appropriate partial Fourier reconstruction known to those skilled in the art.

Referring to FIG. 11, the MRI apparatus 200 may use k-space 658 to fill a part of the k space with partial data (data of first line to 120th line) in operation S710, extract central region data, in operation S720, and perform inverse Fourier conversion on the central region data to generate first MR image 810 ($m_s(x,y)$), in operation S730. Phase information ($p(x,y)=\exp(i\arg(m_s(x,y)))$) of the first MR image 810 may be calculated, in operation S760.

The MRI apparatus 200 may perform inverse Fourier conversion on the partial data to generate a second MR image 820 ($m_i(x,y)$), in operation S740. The MRI apparatus 200 may calculate magnitude information ($\text{abs}(m_i(x,y))$) of the second MR image 820 in operation S750.

The MRI apparatus 200 may generate a third MR image 830 in operation S770 based on the phase information calculated in operation S760 and the magnitude information calculated in operation S750.

The MRI apparatus 200 may generate k space data in operation S780 by performing Fourier transform on the third MR image 830, and may fill the k space data in operation S790, i.e., with the data of 121st to 200th lines.

Accordingly, the MRI apparatus 200 may obtain the full data of the k space by applying the partial Fourier reconstruction method on the partial data of the k space.

Figure 12C:
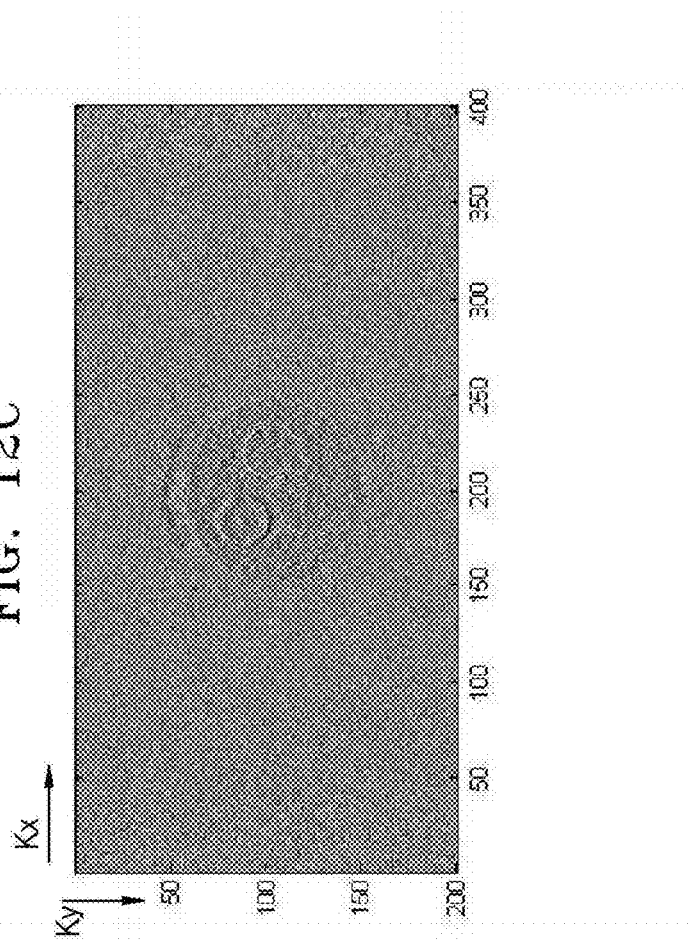
FIGS. 12A, 12B, and 12C are diagrams of MR images according to exemplary embodiments.
Figure 12A:
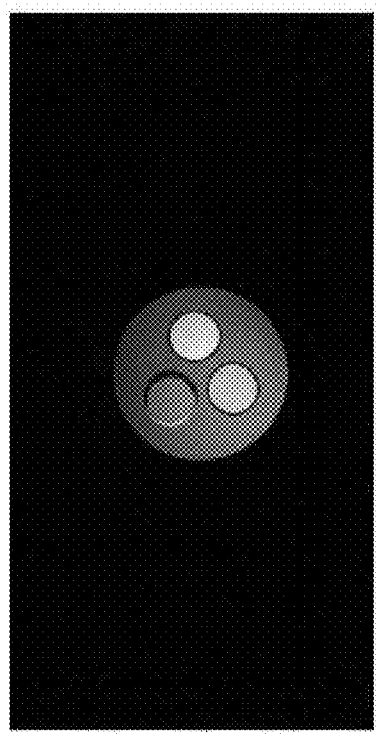
Figure 12B:
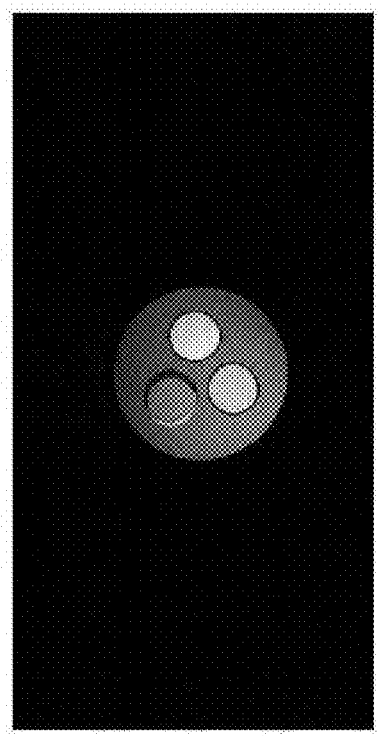

FIG. 12A shows an MR image generated by full-sampling an MR signal corresponding to a k space, FIG. 12B shows an MR image generated by full-sampling partial data of the k space and then using a partial Fourier reconstruction (POCS) method, and FIG. 12C shows a difference image between the MR image of FIG. 12A and the MR image of FIG. 12B.

Figure 13A:
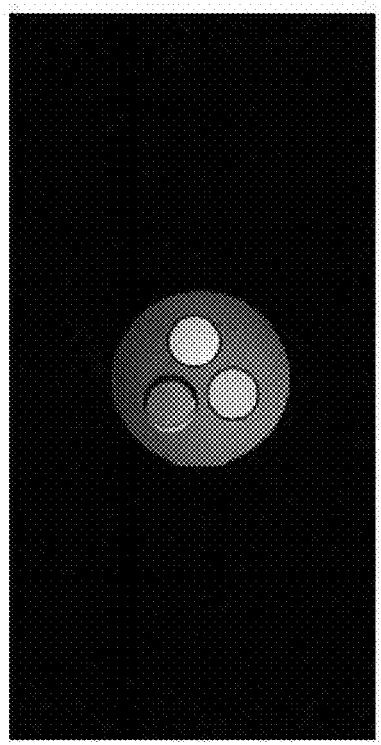
FIGS. 13A, 13B, and 13C are diagrams of MR images according to exemplary embodiments.
Figure 13C:
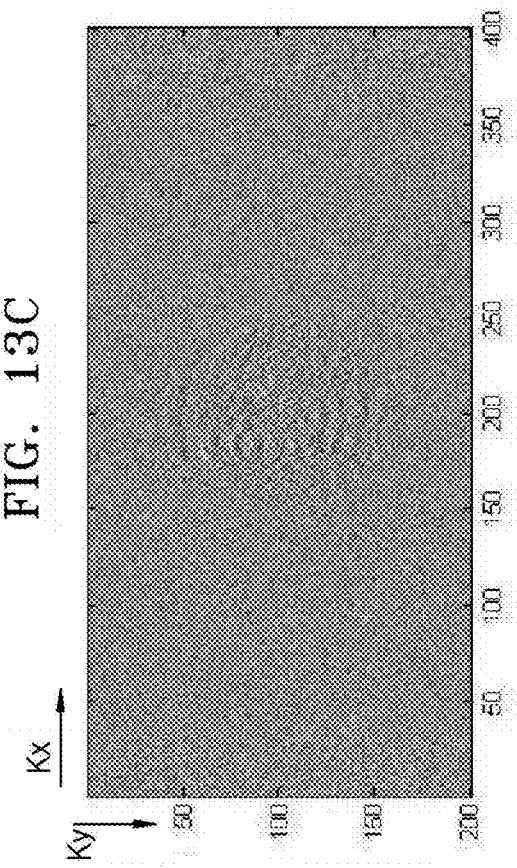
Figure 13B:
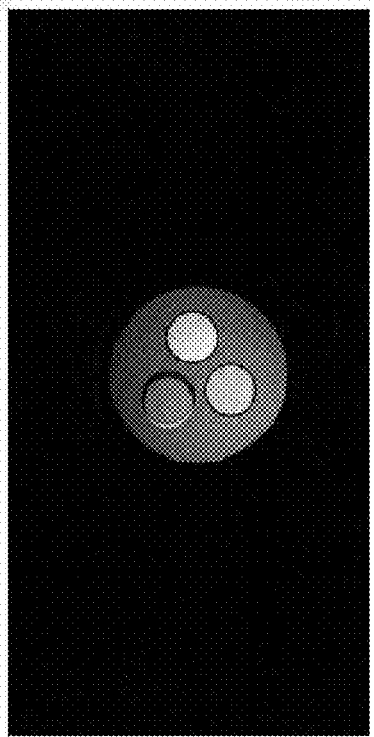

FIG. 13A shows an MR image generated by full-sampling an MR signal corresponding to a k space, FIG. 13B shows an MR image generated by undersampling partial data of the k space, interpolating the partial data by applying a method of sharing data, according to an exemplary embodiment, and then using a partial Fourier reconstruction (POCS) method based on the interpolated partial data, and FIG. 13C shows a difference image between the MR image of FIG. 13A and the MR image of FIG. 13B.

Referring to FIG. 13C, there is no difference between the MR image generated by full-sampling the MR signal corresponding to the k space and the MR image obtained by using the exemplary method of sharing data and the partial Fourier reconstruction method. Also, comparing FIG. 13C and FIG. 12C, the MR image generated by full-sampling the MR signal corresponding to the k space is more similar to the MR image obtained by using the exemplary method of sharing data and the partial Fourier reconstruction method than the MR image generated without using the exemplary method of sharing data.

In other words, comparing FIG. 13C and FIG. 12C, data obtained via the method of sharing data according to an exemplary embodiment has a low phase variation, and thus, has fewer artifacts.

Table 1 below shows times taken for obtaining k space data according to repetition time values TR.

TABLE 1

| TR (ms) | Comparative Example 1 (s) | Example 1 (s) | Example 2 (s) |
|---|---|---|---|
| 50 | 10 | 3.8 | 2.5 |
| 100 | 20 | 8.8 | 6.1 |
| 200 | 40 | 19.2 | 12.8 |
| 300 | 60 | 22.8 | 15 |
| 500 | 100 | 44 | 30.8 |
| 1000 | 200 | 96 | 64 |
| 2000 | 400 | 152 | 100 |
| Total Time (s) | 830 | 346.6 | 230.9 |

In Table 1, Comparative Example 1 shows times taken for obtaining k space data when a k space is full-sampled, Example 1 shows times taken for obtaining k space data when a method of sharing data, according to an exemplary embodiment is applied, and Example 2 shows times taken for obtaining k space data when a method of sharing data and a partial Fourier reconstruction method according to an exemplary embodiment are applied.

Referring to Table 1, the times in Example 1 are 2.3 times less than the times in Comparative Example 1, and the times in Example 2 are 3.6 times less than the times in Comparative Example 1.

Also, referring to the difference images in FIGS. 8C and 13C, the MR images generated by using the k space data of Examples 1 and 2 have similar qualities compared to Comparative Example 1.

Accordingly, when an MR parameter map or an MR image is generated based on an interpolated k space by applying a method of sharing data, according to an exemplary embodiment, the quality of the MR image may be maintained or improved, and a time for obtaining data may be reduced.

As described above, according to one or more of exemplary embodiments, unsampled data of a current k space may be efficiently obtained by using sampled data of another k space.

Accordingly, the quality of an MR image may be maintained or improved and a time taken for obtaining k space data is reduced.

The exemplary embodiments can be written as computer programs and can be implemented in computers that execute the programs using a computer-readable recording medium. Examples of the computer-readable recording medium include magnetic storage media (e.g., ROM, floppy disks, hard disks, etc.), optical recording media (e.g., CD-ROMs or DVDs), etc.

The described-above exemplary embodiments and advantages are merely exemplary and are not to be construed as limiting. The present teaching can be readily applied to other types of apparatuses. The description of exemplary embodiments is intended to be illustrative, and not to limit the scope of the claims, and many alternatives, modifications, and variations will be apparent to those skilled in the art.

What is claimed is:

1. A magnetic resonance imaging (MRI) apparatus comprising:

a data processor configured to obtain a first k space data comprising a first unacquired line data by undersampling an MR signal based on a first value of an MR parameter, which is selected from acquisition parameters of the MR signal, the acquisition parameters including at least a repetition time (TR), a flip angle (FA), and an inversion time (TI), and to obtain a second k space data comprising a second unacquired line data by undersampling the MR signal based on a second value of the MR parameter, the second value being different from the first value; and an image processor configured to interpolate a portion of the first unacquired line data in the first k space data based on the second k space data, and to interpolate a portion of the second unacquired line data in the second k space data based on the first k space data.

2. The MRI apparatus of claim 1, wherein the first unacquired line data is disposed in a second region of a first k space, the second unacquired line data is disposed in a second region of a second k space, the data processor is configured to obtain the first k space data by sampling the MR signal corresponding to a first region of the first k space and by sampling the MR signal corresponding to a portion of the second region of the first k space, and to obtain the second k space data by sampling the MR signal corresponding to a first region of the second k space and by sampling the MR signal corresponding to a portion of the second region of the second k space, and the image processor is configured to interpolate the first unacquired line data based on acquired line data of the second k space corresponding to the first unacquired line data, and to interpolate the second unacquired line data based on acquired line data of the first k space corresponding to the second unacquired line data.

3. The MRI apparatus of claim 2, wherein each of the first region of the first k space and the first region of the second k space is a central region of the first k space or the second k space, respectively, and each of the second region of the first k space and the second region of the second k space is a peripheral region of the first k space or the second k space, respectively.

4. The MRI apparatus of claim 2, wherein each of the first region of the first k space and the first region of the second k space is an auto-calibration signal (ACS) region.

5. The MRI apparatus of claim 2, wherein each of the first k space data corresponding to the first region of the first k space and the second k space data corresponding to the first region of the second k space is a low frequency data, and each of the first k space data corresponding to the second region of the first k space and the second k space data corresponding to the second region of the second k space is a high frequency data.

6. The MRI apparatus of claim 2, wherein the image processor is configured to interpolate each of the first unacquired line data and the second unacquired line data based on a first weight of the first k space and a second weight of the second k space.

7. The MRI apparatus of claim 6, wherein the image processor is further configured to calculate the first weight based on the first k space data of the first region of the first k space, and calculate the second weight based on the second k space data of the first region of the second k space.

8. The MRI apparatus of claim 7, wherein the image processor is further configured to calculate a Euclidean norm value of the first region of the first k space as the first weight, and calculate the Euclidean norm value of the first region of the second k space as the second weight.

9. The MRI apparatus of claim 6, wherein the image processor is further configured to interpolate the first unacquired line data by multiplying a ratio of the first weight to the second weight by the acquired line data of the second k space corresponding to the first unacquired line data, and to interpolate the second unacquired line data by multiplying a ratio of the second weight to the first weight by the acquired line data of the first k space corresponding to the second unacquired line data.

10. The MRI apparatus of claim 1, wherein the image processor is further configured to perform a partial Fourier reconstruction on at least one among the interpolated portion of the first k space data and the interpolated portion of the second k space data.

11. The MRI apparatus of claim 1, wherein the image processor is further configured to generate an MR parameter map based on the interpolated portion of the first k space data and the interpolated portion of the second k space data.

12. The MRI apparatus of claim 1, wherein the MR parameter is the TR, and
the data processor is further configured to obtain the first k space data in which the MR signal is obtained by setting the TR as the first value, and to obtain the second k space data in which the MR signal is obtained by setting the TR as the second value.

13. A method of operating a magnetic resonance imaging (MRI) apparatus, the method comprising:
obtaining a first k space data comprising a first unacquired line data by undersampling an MR signal based on a first value of an MR parameter, which is selected from acquisition parameters of the MR signal, the acquisition parameters including at least a repetition time (TR), a flip angle (FA), and an inversion time (TI);
obtaining a second k space data comprising a second unacquired line data by undersampling the MR signal based on a second value of the MR parameter, the second value being different from the first value; and
interpolating a portion of the first unacquired line data in the first k space data based on the second k space data, and a portion of the second unacquired line data in the second k space data based on the first k space data.

14. The method of claim 13, wherein the first unacquired line data is disposed in a second region of a first k space,
the second unacquired line data is disposed in a second region of a second k space,
the obtaining the first k space data comprises sampling the MR signal corresponding to a first region of the first k space and sampling the MR signal corresponding to a portion of the second region of the first k space,
the obtaining the second k space data comprises sampling the MR signal corresponding to a first region of the second k space and sampling the MR signal corresponding to a portion of the second region of the second k space, and
the interpolating comprises interpolating the first unacquired line data based on acquired line data of the second k space corresponding to the first unacquired line data, and interpolating the second unacquired line data based on acquired line data of the first k space corresponding to the second unacquired line data.

15. The method of claim 14, wherein each of the first region of the first k space and the first region of the second k space is a central region of the first k space or the second k space, respectively, and each of the second region of the first k space and the second region of the second k space is a peripheral region of the first k space or the second k space, respectively.

16. The method of claim 14, wherein each of the first region of the first k space and the first region of the second k space is an auto-calibration signal (ACS) region.

17. The method of claim 14, wherein each of the first k space data corresponding to the first region of the first k space and the second k space data corresponding to the first region of the second k space is a low frequency data, and
each of the first k space data corresponding to the second region of the first k space and the second k space data corresponding to the second region of the second k space is a high frequency data.

18. The method of claim 14, wherein the interpolating comprises:
interpolating each of the first unacquired line data and the second unacquired line data based on a first weight of the first k space and a second weight of the second k space.

19. The method of claim 18, wherein the interpolating further comprises:
calculating the first weight based on the first k space data of the first region of the first k space, and
calculating the second weight based on the second k space data of the first region of the second k space.

20. The method of claim 19, wherein the calculating the first weight comprises calculating a Euclidean norm value of the first region of the first k space as the first weight, and
wherein the calculating the second weight comprises calculating the Euclidean norm value of the first region of the second k space as the second weight.

21. The method of claim 18, wherein the interpolating further comprises:
interpolating the first unacquired line data by multiplying a ratio of the first weight to the second weight by the acquired line data of the second k space corresponding to the first unacquired line data; and
interpolating the second unacquired line data by multiplying a ratio of the second weight to the first weight by the acquired line data of the first k space corresponding to the second unacquired line data.

22. The method of claim 13, further comprising:
performing a partial Fourier reconstruction on at least one among the interpolated portion of the first k space data and the interpolated portion of the second k space data.

23. The method of claim 22, further comprising:
generating an MR parameter map based on the interpolated portion of the first k space data and the interpolated portion of the second k space data.

24. A non-transitory computer-readable recording medium having recorded thereon a program which, when executed by a computer system, causes the computer system to execute the method of claim 13.

25. A magnetic resonance imaging (MRI) method comprising:
obtaining MR signals from an imaging region of an object, respectively based on a first value of an MR parameter and a second value of the MR parameter, the second value different from the first value, of the MR parameter, which is selected from acquisition parameters of the MR signals, the acquisition parameters including at least a repetition time (TR), a flip angle (FA), and an inversion time (TI);

generating a first region of a first k space comprising data in each line and generating a first region of a second k space comprising data in each line, based on the obtained MR signals;

generating a second region of the first k space and a second region of the second k space by respectively undersampling the obtained MR signals so that some lines in each second region does not comprise data;

interpolating, with one another, portions of the second region of the first k space and the second region of the second k space, the portions being interpolated do not comprise the data; and obtaining an MR image based on an interpolated k space comprising the data of the interpolated portions and one of the first region of the first k space and the first region of the second k space.

26. The method of claim 25, wherein the interpolating comprises:

interpolating the data lacking in the second region of the first k space based on the lines which comprise the data in the second region of the second k space and correspond to the lines lacking the data in the first k space, and interpolating the data lacking in the second region of the second k space based on the lines which comprise the data in the second region of the first k space and correspond to the lines lacking the data in the second k space.

27. The method of claim 25, wherein each of the first k space and the second k space is symmetrical with respect to a central axis, each of the first region of the first k space and the first region of the second k space is a central region of the first k space and the second k space, respectively, and comprises an auto-calibration signal (ACS) region, and each of the second region of the first k space and the second region of the second k space is a peripheral region of the first k space and the second k space, respectively, and comprises two peripheral sub-regions disposed symmetrically with respect to the central axis.

28. The method of claim 27, wherein the interpolating comprises:

interpolating only one of the two peripheral sub-regions of the first k space or the second k space.

29. The method of claim 28, wherein the obtaining the MR image comprises:

filling a first intermediate k space with partial data of the first k space or the second k space, to include a first data of the first region of the first k space or the first region of the second k space, a second data of the interpolated one of the two peripheral sub-regions, and a missing data portion in correspondence to other one of the two peripheral sub-regions that has not been interpolated;

extracting the first data from the first intermediate k space;

calculating a first intermediate MR image based on the extracted first data;

calculating a second intermediate MR image based on the partial data of the first intermediate k space;

calculating a third intermediate MR image based on the first intermediate MR image and the second intermediate MR image;

generating a second intermediate k space based on the third intermediate MR image;

generating a final k space by filling the missing data portion of the first intermediate k space with data of corresponding lines of the second intermediate k space; and generating a final MR image based on the final k space.

30. An MRI apparatus configured to perform the method of claim 25.

* * * * *